United States Patent
Kim et al.

(10) Patent No.: US 11,664,414 B2
(45) Date of Patent: May 30, 2023

(54) SINGLE CRYSTAL MATERIAL AND METHOD OF FORMING THE SAME AND STACKED STRUCTURE AND CERAMIC ELECTRONIC COMPONENT AND DEVICE

(71) Applicant: SAMSUNG ELECTRONICS CO., LTD., Suwon-si (KR)

(72) Inventors: Hyungjun Kim, Suwon-si (KR); Doh Won Jung, Seoul (KR); Chan Kwak, Yongin-si (KR); Ki Hong Kim, Asan-si (KR); Daejin Yang, Yeongju-si (KR); Chang Soo Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 87 days.

(21) Appl. No.: 17/148,787

(22) Filed: Jan. 14, 2021

(65) Prior Publication Data

US 2021/0134941 A1    May 6, 2021

Related U.S. Application Data

(63) Continuation of application No. 16/541,883, filed on Aug. 15, 2019, now Pat. No. 10,937,857.

(30) Foreign Application Priority Data

Feb. 14, 2019   (KR) .................... 10-2019-0017364

(51) Int. Cl.
*H01L 49/02* (2006.01)
*B32B 18/00* (2006.01)
(Continued)

(52) U.S. Cl.
CPC .............. *H01L 28/55* (2013.01); *B32B 18/00* (2013.01); *C04B 35/495* (2013.01); *H01G 4/10* (2013.01); *H01G 4/33* (2013.01); *H01L 28/60* (2013.01)

(58) Field of Classification Search
CPC ......... H01L 28/55; H01L 28/60; B32B 18/00; C04B 35/495; H01G 4/33; H01G 4/10; H01G 4/1227; H01G 4/30
See application file for complete search history.

(56) References Cited

U.S. PATENT DOCUMENTS 6,197,651 B1    3/2001  Shan
6,300,216 B1   10/2001  Shan
(Continued)

FOREIGN PATENT DOCUMENTS

WO    WO-2009031332 A1 *  3/2009   ............... C30B 1/02

OTHER PUBLICATIONS

Fang et al., "Dielectric Properties of the Lamellar Niobates and Titanoniobates AM2Nb3O10 and ATiNbO5 (A=H, K, M=Ca, Pb), and their Condensation Products Ca4Nb6O19 and Ti2Nb2O9", Chem.Mater. 11, 1999, 1519-1525.
(Continued)

*Primary Examiner* — Jose R Diaz
(74) *Attorney, Agent, or Firm* — Cantor Colburn LLP

(57) ABSTRACT

A stacked structure including: a single crystal substrate and, single crystal material on the single crystal substrate, wherein the single crystal material has a same crystallographic orientation as a crystallographic orientation of the single crystal substrate. Also a method of forming the stacked structure, a ceramic electronic component, and a device.

20 Claims, 23 Drawing Sheets

(51) Int. Cl.
*H01G 4/33* (2006.01)
*C04B 35/495* (2006.01)
*H01G 4/10* (2006.01)

(56) References Cited

U.S. PATENT DOCUMENTS

| | | |
|---|---|---|
| 6,573,211 B2 | 6/2003 | Tatsumi |
| 7,352,022 B2 | 4/2008 | Lee et al. |
| 8,048,511 B2 | 11/2011 | Uetsuka et al. |
| 8,184,426 B2 | 5/2012 | Osada et al. |
| 9,082,551 B2 | 7/2015 | Osada et al. |
| 2013/0101829 A1 | 4/2013 | Sasaki et al. |
| 2016/0072124 A1* | 3/2016 | Pan .................... H01M 4/0423 429/231.1 |

OTHER PUBLICATIONS

Jung et al., "Oriented Film Growth of Ba1-xSrxTiO3 Dielectrics on Glass Substrates Using 2D Nanosheet Seed Layer", Applied Materials & Interfaces, 2013, 5(11), 4592.

Li et al., "High Thermal Robustness of Molecularly Thin Perovskite Nanosheets and Implications for Superior Dielectric Properties", ACS NANO, vol. 8, No. 6, 2014, 5449-5461.

Shuanlong Feng et al., "Synthesis of Single Crystalline Anatase TiO.sub.2 (001) Tetragonal Nanosheet-Array Films on Fluorine-Doped Tin Oxide Substrate", Journal of American Ceramics, 94(2), The American Ceramics Society, 2011, pp. 310-315 (year 2011).

* cited by examiner

A-A'

SINGLE CRYSTAL MATERIAL AND METHOD OF FORMING THE SAME AND STACKED STRUCTURE AND CERAMIC ELECTRONIC COMPONENT AND DEVICE

CROSS-REFERENCE TO RELATED APPLICATION

This application is a continuation of U.S. application Ser. No. 16/541,883, filed on Aug. 15, 2019, which claims priority to and the benefit of Korean Patent Application No. 10-2019-0017364, filed in the Korean Intellectual Property Office on Feb. 14, 2019, and all the benefits therefrom under 35 U.S.C. § 119, the entire contents of which are incorporated herein by reference.

BACKGROUND

1. Field

A single crystal material and a method of forming the same, a stacked structure, a ceramic electronic component, and a device are disclosed.

2. Description of the Related Art

A ceramic electronic component including a ceramic material includes a capacitor, an inductor, a piezoelectric device, a varistor, or a thermistor. Among them, capacitors are components used in electronic circuits. A multi-layer ceramic capacitor (MLCC), which is one example of the capacitor, can include a plurality of capacitors. The MLCC may be formed in, for example, a chip shape, so that it may be mounted in a flexible printed circuit (FPC). The MLCC may be used in various electronic devices including a display device such as a liquid crystal display (LCD), a computer, a mobile phone, and vehicle devices such as electric vehicles and smart cars to charge and discharge electricity, and it may be used in a device for coupling, decoupling, impedance matching, and the like.

Components to provide an electronic device with an improved performance, an improved efficiency, and a smaller-size would be desirable.

SUMMARY

An embodiment provides a single crystal material that is applicable as a dielectric and may provide a reduced thickness with an easier process.

Another embodiment provides a method of forming the single crystal material.

Yet another embodiment provides a stacked structure including the single crystal material.

Still another embodiment provides a ceramic electronic component including the single crystal material or the stacked structure.

Further embodiment provides a device including the ceramic electronic component.

According to an embodiment, a stacked structure includes a single crystal substrate, and a single crystal material on the single crystal substrate, wherein the single crystal material is formed from a plurality of nanosheets, has a same crystallographic orientation as a crystallographic orientation of the single crystal substrate.

A crystal structure of the single crystal material may be the same as a crystal structure of the single crystal substrate.

The single crystal material may include elements composed of nanosheets from which the single crystal material is provided.

The single crystal material may include a sintered product of the nanosheets.

The nanosheet may include an exfoliated nanostructure of a layered material, a chalcogenide, a carbon structure, or a heterostructure.

The single crystal material may be a multinary single crystal material including ternary or more.

The nanosheet may include an exfoliated nanostructure of a layered material, a chalcogenide, a carbon structure, or a heterostructure.

The exfoliated nanostructure of the layered material may be an exfoliated nanostructure of layered perovskite.

The exfoliated structure of the layered material may be represented by one of Chemical Formulae 1 to 3.

  Chemical Formula 1

  Chemical Formula 2

  Chemical Formula 3 wherein, in Chemical Formulae 1 to 3,

A is at least one selected from Na, K, Rb, Mg, Ca, Sr, Ba, Bi, Hf, Ag, Cd, Ti, Pb, and lanthanide elements, M is different from A and at least one selected from Li, Sc, Ti, Zr, V, Nb, Ta, Cr, Mo, W, Mn, Tc, Re, Fe, Ru, Os, Co, Rh, Ir, Ni, Pd, Pt, Cu, Zn, Al, Ga, In, Ge, Sn, Sb, Bi, and Te, $n \geq 1$ and $p \geq 1$.

The single crystal material may be a thin film having a thickness of about 0.5 nm to about 100 nm.

The single crystal substrate may include a metal single crystal, a semi-metal single crystal, a binary compound, an oxide, a nitride, a sulfide, a phosphide, an arsenide, a carbide, or a combination thereof.

The single crystal substrate may include at least one of barium (Ba) and strontium (Sr), and titanium (Ti).

According to another embodiment, a single crystal material formed from a plurality of nanosheets and having a different crystal structure from the nanosheets is provided.

The single crystal material may include elements composed of the nanosheets.

The single crystal material may include a sintered product of the nanosheets.

The single crystal material may be a multinary single crystal material including ternary or more.

The single crystal material may be a thin film having a thickness of about 0.5 nm to about 100 nm.

Disclosed is a precursor assembly including: a single crystal substrate, and an exfoliated nanostructure of a layered material, a chalcogenide, a carbon structure, or a heterostructure on the single crystal substrate.

According to another embodiment, a ceramic electronic component includes the stacked structure or the single crystal material.

According to another embodiment, a device includes the ceramic electronic component.

According to another embodiment, a method of forming a single crystal material includes providing a plurality of nanosheets, disposing the plurality of nanosheets on a single crystal substrate, and heat-treating to form a single crystal material having a same crystallographic orientation as a crystallographic orientation of the single crystal substrate to form the single crystal material.

The applying of the plurality of nanosheets may include coating nanosheet dispersion including the plurality of nanosheets by a Langmuir-Blodgett method, a Layer-by-Layer method, a spin coating, a slit coating, a bar coating, or a dip coating to form a two-dimensional nanosheet monolayer.

The applying of the plurality of nanosheets may include forming the plurality of two-dimensional nanosheet monolayers by performing forming of the two-dimensional nanosheet monolayer in a plurality of times.

The heat-treatment may be performed at a higher temperature than a temperature at which the crystal structures of the nanosheets are changed.

The heat-treatment may be performed at about 300° C. to about 1800° C.

The method may further include additional annealing after the heat-treatment at a temperature lower than a temperature at which the heat-treatment is performed.

The single crystal material may be formed with a thin thickness by an easy process without an equipment such as a vacuum chamber, thus realizing a dielectric with good dielectric characteristics.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
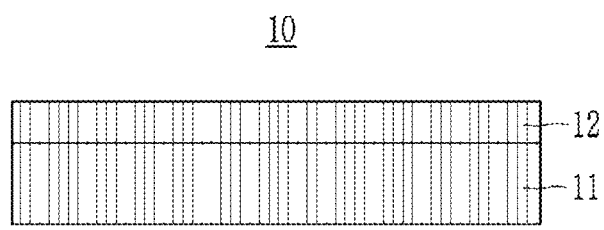
FIG. 1 is a cross-sectional view schematically showing an embodiment of a stacked structure.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a stacked structure according to an embodiment will be described with reference to the drawings.

A stacked structure according to an embodiment may be for example a dielectric, a semiconductor, a conductor, or a combination thereof.

FIG. 1 is a schematic cross-sectional view of a stacked structure according to an embodiment.

Referring to FIG. 1, a stacked structure 10 according to an embodiment includes a single crystal substrate 11 and a single crystal material 12. The single crystal substrate 11 may have a single crystal structure in which the entire crystal is orderly arranged along with a predetermined crystal axis, and may have substantially no grain boundary. The single crystal substrate 11 may have, for example, a cubic, trigonal, orthorhombic, hexagonal, or rhombohedral crystal structure. The crystallographic direction (plane direction) of the single crystal substrate 112 may be, for example, (100), (111), (110), or (010).

The single crystal substrate 11 may be in the form of a single crystal, and comprise, for example, a metal, a semi-metal, a binary compound, an oxide, a nitride, a sulfide, a phosphide, an arsenide, a carbide, or a combination thereof, but is not limited thereto. The single crystal substrate 11 may include, for example, at least one of Si, Al, Ba, Sr, Ti, Ga, As, Sb, In, La, Li, Nb, Mg, Ta, Si, Te, Y, and Zn, for example, may be at least one of $Al_2O_3$ (e.g., sapphire), AlN, $BaTiO_3$, M-doped $BaTiO_3$ (M may be at least one of a metal or a semi-metal, for example, and may be Nb), $SrTiO_3$, M-doped $SrTiO_3$ (M may be at least one of a metal or semi-metal, for example, and may be Nb), GaAs, GaSb, GaN, GaP, InP, InAs, $LaAlO_3$, $LiNbO_3$, MgO, $MgAl_2O_4$ (e.g., spinel), $SrLaAlO_4$, $SrLaGaO_4$, $Sr_2AlTaO_6$, SiC, $SiO_2$ (quartz), $TiO_2$, $TeO_2$, $YAlO_3$, ZnO, and ZnS. A combination thereof may be used, but is not limited thereto.

For example, the single crystal substrate 11 may be an oxide, for example, may include at least one of barium (Ba) and strontium (Sr), and titanium (Ti), and, for example, may be $BaTiO_3$, M-doped $BaTiO_3$ (M is the same as described above), $SrTiO_3$, or M-doped $SrTiO_3$ (M is the same as described above).

The single crystal material 12 may be disposed on at least one surface of the single crystal substrate 11, for example, may be disposed on a surface, e.g., opposite surfaces, of the single crystal substrate 11. For example, the single crystal material 12 may be a single crystal thin film disposed on a surface, e.g., opposite surfaces, of the single crystal substrate 11, for example, may be a single crystal thin film having a thickness of about 0.5 nanometers (nm) to about 100 nm. For example, the single crystal material 12 may have a thickness of about 1 nm to about 50 nm, about 2 nm to about 40 nm, or about 4 nm to about 30 nm, and within the range, may have a thickness of about 1 nm to about 30 nm, about 1 nm to about 20 nm, about 1 nm to about 10 nm, about 1 nm to about 9 nm, about 1 nm to about 8 nm, or about 1 nm to about 7 nm.

The single crystal material 12 may be obtained using a plurality of nanosheets as a precursor, for example, and may be a product obtained by coating a plurality of nanosheets and then heat-treating. For example, the single crystal material 12 may be a sintered product of the nanosheets.

Each ceramic nanosheet may have a thin sheet-shape with a predetermined lateral size. The lateral size of the nanosheet may be for example about 0.1 μm to about 30 μm, about 0.2 μm to about 20 μm, about 0.3 pm to about 15 μm, or about 0.5 μm to about 10 μm. The nanosheet may be, for example, a dielectric, a semiconductor, a conductor, or a combination thereof. A dielectric is mentioned. An average thickness of the ceramic nanosheet may be, for example, less than or equal to about 5 nm, less than or equal to about 3 nm, less than or equal to about 2 nm, or less than or equal to about 1.5 nm, about 0.5 nm to about 5 nm, about 0.5 nm to about 3 nm, about 0.5 nm to about 2 nm, or about 0.5 nm to about 1.8 nm, about 1 nm to about 5 nm, about 1 nm to about 3 nm, about 1 nm to about 2 nm, or about 1 nm to about 1.8 nm.

The nanosheet may be, for example, a dielectric, a semiconductor, a conductor, or a combination thereof, and may be a unary material, a binary material, or a multinary material such as a ternary material. For example, the nanosheet may be a multinary material such as a binary, ternary or more of an oxide, a nitride, a sulfide, a phosphide, an arsenide, a carbide, or a combination thereof. For example, the nanosheet may be ternary to quinary material.

For example, the nanosheet may be, for example, an exfoliated nanostructure of a material having a layered structure (hereinafter, referred to as a 'layered material'), a chalcogenide, a carbon structure, a heterostructure, or a combination thereof.

A precursor assembly may comprise a single crystal substrate, and an exfoliated nanostructure of a layered material, a chalcogenide, a carbon structure, or a heterostructure on the single crystal substrate. The exfoliated nanostructure of a layered material may be, for example, an exfoliated nanostructure of the layered dielectric, for example, an exfoliated nanostructure of layered perovskite dielectric, for example, a dielectric exfoliated nanostructure of aurivillius phase, e.g., a perovskite of the formula $(Bi_2O_2)(A_{n-1}M_nO_{3n+1})$ where A is a large 12 co-ordinate cation, and M is a 6 co-ordinate cation), ruddlesden-popper phase, e.g., a perovskite type material of the formula $A_{n+1}M_nX_{3n+1}$, where A and M are cations, X is an anion (e.g., oxygen), and n is the number of the layers of octahedra in the perovskite-like stack, a Dion-Jacobson phase, e.g., a perovskite in which an alkali metal is preset every n $ABO_3$ layers, and titano-niobate phase.

For example, the exfoliated nanostructure of a layered material may be a dielectric represented by one of Chemical Formulae 1 to 3.

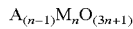  Chemical Formula 1

$$A_{(n-1)}M_nO_{(3n+1)}$$

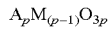  Chemical Formula 2

$$A_pM_{(p-1)}O_{3p}$$

  Chemical Formula 3

$$M_pO_{(sp+1)}$$

In Chemical Formulae 1 to 3, each A may independently be at least one of Na, K, Rb, Mg, Ca, Sr, Ba, Bi, Hf, Ag, Cd, Ti, Pb, and a lanthanide elements, each M may be different from A and is independently at least one of Li, Sc, Ti, Zr, V, Nb, Ta, Cr, Mo, W, Mn, Tc, Re, Fe, Ru, Os, Co, Rh, Ir, Ni, Pd, Pt, Cu, Zn, Al, Ga, In, Ge, Sn, Sb, Bi, and Te, $n \geq 1$ and $p \geq 1$.

For example, n and p may satisfy: $1 \leq n \leq 10$ and $1 \leq p \leq 10$.

For example, the exfoliated nanostructure of the layered material may include at least one of $Ca_2Nb_3O_{10}$, $Ca_2NaNb_4O_{13}$, $Ca_2Na_2Nb_5O_{16}$, $Sr_2Nb_3O_{10}$, $Sc_{2-x}Ba_xNb_3O_1$ ($0<x<2$), $SrBi_4Ti_4O_{15}$, $Sr_{2-x}Ba_xBi_4Ti_4O_{15}$ ($0<x<2$), $Ti_2NbO_7$, and $LaNb_2O_7$, but is not limited thereto.

The chalcogenide may be a compound including at least one chalcogen anion and may be, for example, a Group III chalcogenide, a Group IV chalcogenide, or a combination thereof.

The carbon structure may include a two dimensional sheet-shaped material, for example, graphite or a derivative thereof, and/or graphene or a derivative thereof.

The heterostructure may be an exfoliated nanostructure of the two-dimensional semiconductor, and may include, for example, a hexagonal boron nitride (h-BN), $WS_2$, $WSe_2$, $MoS_2$, $MoSe_2$, or a combination thereof.

The nanosheet may be transited into a stable phase at a high temperature. For example, two or more phases may co-exist.

As described above, the single crystal material 12 may be a resulting material obtained using the nanosheet as a precursor. Thereby, the single crystal material 12 may include elements composing of the nanosheet. For example, the elements for the single crystal material 12 may be the same as the elements for the nanosheet.

For example, the single crystal material 12 may be a single crystal material of a unary single crystal material or a multinary single crystal material such as a binary, ternary or more single crystal material. For example, the single crystal material 12 may be an oxide, a nitride, a sulfide, a phosphide, an arsenide, a carbide of a multinary material such as binary or ternary or more, or a combination thereof. For example, the single crystal material 12 may be a ternary to quinary element material.

As is further described above, the single crystal material 12 may be a resulting material obtained by heat-treating the nanosheet. Thereby, the phase of the crystal structure of the nanosheet may be changed by the heat-treatment, so the crystal structure of the single crystal material 12 may be different from the crystal structure of the nanosheet.

For example, the crystal structure of the single crystal material 12 may be changed depending upon the crystal structure of the single crystal substrate 11 disposed under the single crystal material 12. For example, the single crystal material 12 may have the same orientation as the crystallographic orientation of the single crystal substrate 11. For example, from the X-ray diffraction (XRD), it may be observed that the single crystal material 12 and the single crystal substrate 11 have peaks in a substantially identical region, thereby it is estimated that a plane direction of the single crystal material 12 is substantially identical to a plane direction of the single crystal substrate 11. Thus the crystal structure of the single crystal material 12 may be identical to the crystal structure of the single crystal substrate 11.

For example, each plane direction of the single crystal substrate 11 and the single crystal material 12 may be (100). For example, each plane direction of the single crystal substrate 11 and the single crystal material 12 may be (111). For example, each plane direction of the single crystal substrate 11 and the single crystal material 12 may be (110). For example, each plane direction of the single crystal substrate 11 and the single crystal material 12 may be (010).

For example, the single crystal substrate 11 and the single crystal material 12 may have a cubic crystal structure, respectively. For example, the single crystal substrate 11 and the single crystal material 12 may have a trigonal crystal structure, respectively. For example, the single crystal substrate 11 and the single crystal material 12 may have an orthorhombic crystal structure, respectively. For example, the single crystal substrate 11 and the single crystal material 12 may have a hexagonal crystal structure, respectively. For example, the single crystal substrate 11 and the single crystal material 12 may have a rhombohedral crystal structure, respectively.

The stacked structure 10 may be a dielectric, a semiconductor, or a conductor. A dielectric stacked structure is mentioned.

The single crystal material 12 may be provided by being separated from the single crystal substrate 11, and the single crystal material 12 may be a dielectric, a semiconductor, or a conductor. For example, a dielectric material is mentioned.

Hereinafter, a forming method according to an example of the aforementioned stacked structure or single crystal material is described. FIGS. 2 to 10 are schematic views showing a forming method according to an example of a stacked structure or a single crystal material.

Figure 2:
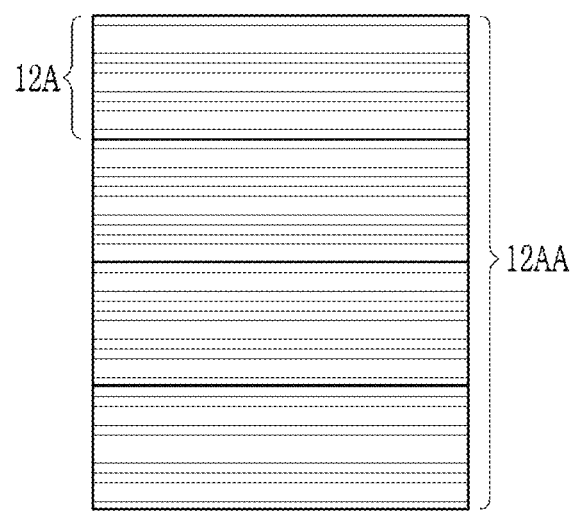
FIGS. 2 to 10 are schematic views showing an embodiment of a method of forming a stacked structure.

Referring to FIG. 2, a layered material 12AA is prepared.

For example, the layered material 12AA may be a layered ceramic material, for example, and may be obtained by heat-treating a mixture including a metal oxide and an alkali metal compound and/or an alkaline-earth metal compound.

For example, the metal oxide may be, for example transition metal oxide, for example an oxide including Nb, Sr, Bi, Ti, Re, V, Os, Ru, Ta, Ir, W, Ga, Mo, In, Cr, Rh, Mn, Co, Fe, or a combination thereof, for example, $Nb_2O_5$ or the like, but is not limited thereto. The metal oxide may exist in a form of, for example hydrate, non-hydrate, or a mixture of hydrate and non-hydrate. The alkali metal compound and/or the alkaline-earth metal compound may be for example a compound including Ca, K, or a combination thereof, for example $CaCO_3$, $K_2CO_3$, and the like, but are not limited thereto. The mixing ratio of the metal oxide and the alkali metal compound and/or the alkaline-earth metal compound may be appropriately chosen considering a composition of the ceramic material to be obtained. For example, about 0.1 mole to about 1 mole of the alkali metal compound and/or the alkaline-earth metal compound may be used per 1 mole of the metal oxide, but is not limited thereto. The heat-treating may be performed, for example, at about 750° C. to about 1800° C. for about 5 hours to about 50 hours under an inert atmosphere such as a nitrogen atmosphere, an argon atmosphere, or a vacuum, but is not limited thereto.

Figure 3:
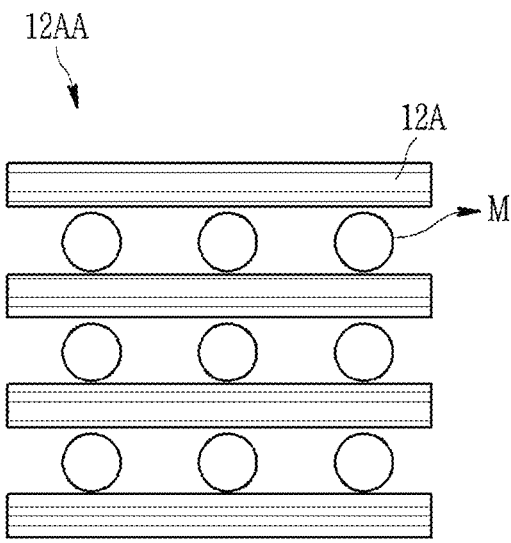

Referring to FIG. 3, the layered material 12AA may have, for example, a three dimensional structure in which an alkali metal and/or an alkaline-earth metal (M) are/is disposed between a plurality of nanosheets 12A. The alkali metal and/or the alkaline-earth metal (M) may be present in a form of a metal cation. The layered material 12AA may be milled to provide a form of a powder.

Subsequently, the layered material 12AA is exfoliated. The exfoliation may be performed by various methods, for example by a protic acid and osmotic pressure, or sequential ion exchange of an organic cation in an intercalation reaction.

Figure 4:
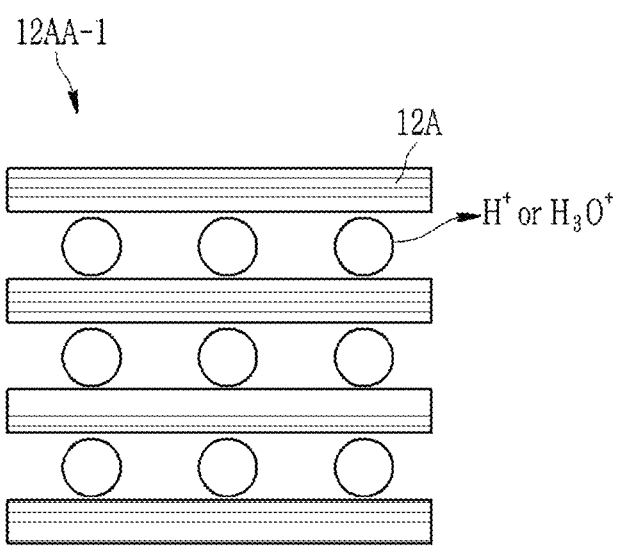

For example, referring to FIG. 4, the layered material 12AA is supplied with an acidic solution such as hydrochloric acid, sulfuric acid, and/or nitric acid to perform an acid exchange to obtain a proton-exchanged layered material (12AA-1) in which at least a part of the alkali metal and/or the alkaline-earth metal (M) is exchanged with proton ($H^+$) or hydronium ion ($H_3O^+$). A concentration, a treatment temperature, and a treatment time of the acidic solution may be appropriately selected, and may be not particularly limited.

Figure 5:
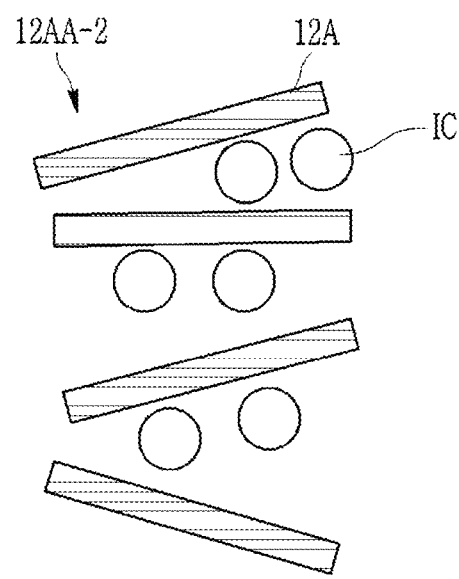
Figure 6:
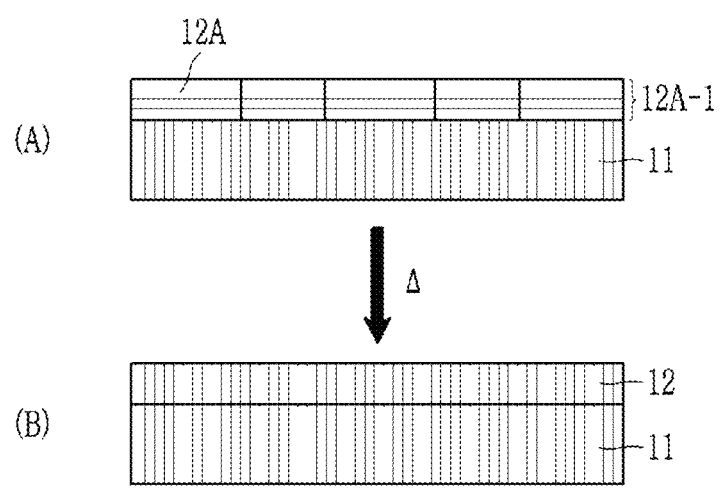

Subsequently, referring to FIG. 5, an intercalated layered material (12AA-2) may be obtained by inserting an intercalant (IC) into the obtained proton-exchanged layered material (12AA-1). The intercalant (IC) may be inserted between nanosheets 12A of the proton-exchanged layered material (12AA-1) to facilitate separating nanosheets 12A each other. The intercalation may be performed using, for example, an organic intercalant, for example, may be performed using a C1 to C20 alkylammonium salt compound as an intercalant (IC), but is not limited thereto. The alkylammonium salt compound may be for example a tetramethylammonium compound such as tetramethylammonium hydroxide, a tetraethyl ammonium compound such as tetraethylammonium hydroxide, a tetrapropyl ammonium compound such as tetrapropylammonium hydroxide, a tetrabutylammonium compound such as tetrabutylammonium hydroxide and/or a benzyl C1 to C6 alkylammonium compound such as benzylmethylammonium hydroxide but is not limited thereto.

The C1 to C6 alkylammonium salt compound may be provided as an aqueous solution, and the concentration of the alkylammonium salt aqueous solution may be about 0.01 mole percent (mol %) to about 20 mol % based on a total moles of protons of the proton exchanged layered material (12AA-1), but is not limited thereto. A temperature and a time of the intercalation are not particularly limited, for example, the intercalation may be performed at about 25° C. to about 80° C. for about 1 day to about 5 days, but is not limited thereto. The intercalant is inserted between layers of the proton-exchanged layered material (12AA-1) to be easily separated as a sheet-shaped nanosheet 12A. For the effective exfoliation, centrifugation, ultrasonic wave, or a combination thereof may be further performed.

The nanosheet 12A exfoliated from the layered material 12AA may be obtained in a form of nanosheet dispersion in which the nanosheet 12A is dispersed in a solvent. The solvent may be for example have a high permittivity, for example water or a polar solvent, and may be for example water, alcohol, acetonitrile, dimethyl sulfoxide, dimethyl formamide, propylene carbonate, or a combination thereof, but is not limited thereto.

Next, referring to FIG. 6A, a plurality of nanosheets 12A are applied on a single crystal substrate 11. The applying the plurality of nanosheets 12A may be performed by supplying a nanosheet dispersion on the single crystal substrate 11 and performing a solution process. For example, the nanosheet dispersion may be coated on the single crystal substrate 11 according to a Langmuir-Blodgett method, a Layer-by-Layer method, a spin coating, a slit coating, a bar coating, or a dip coating to provide a two-dimensional nanosheet monolayer (12A-1). Subsequently, drying may be optionally performed.

Selectively, the step of forming the two-dimensional nanosheet monolayer (12A-1) may be repeated for several times to provide a plurality of two-dimensional nanosheet monolayers (12A-1). For example, 1 to 20 of the two-dimensional nanosheet monolayer (12A-1) may be formed, and within the range, for example, about 1 to about 15, about 1 to about 12, about 1 to about 10, about 1 to about 8, about 1 to about 7, or about 1 to about 5 thereof may be formed.

For example, the two-dimensional nanosheet monolayer may be formed according to a Langmuir-Blodgett method. Relating to this, it is described with references to FIGS. 7 to 10.

Figure 7:
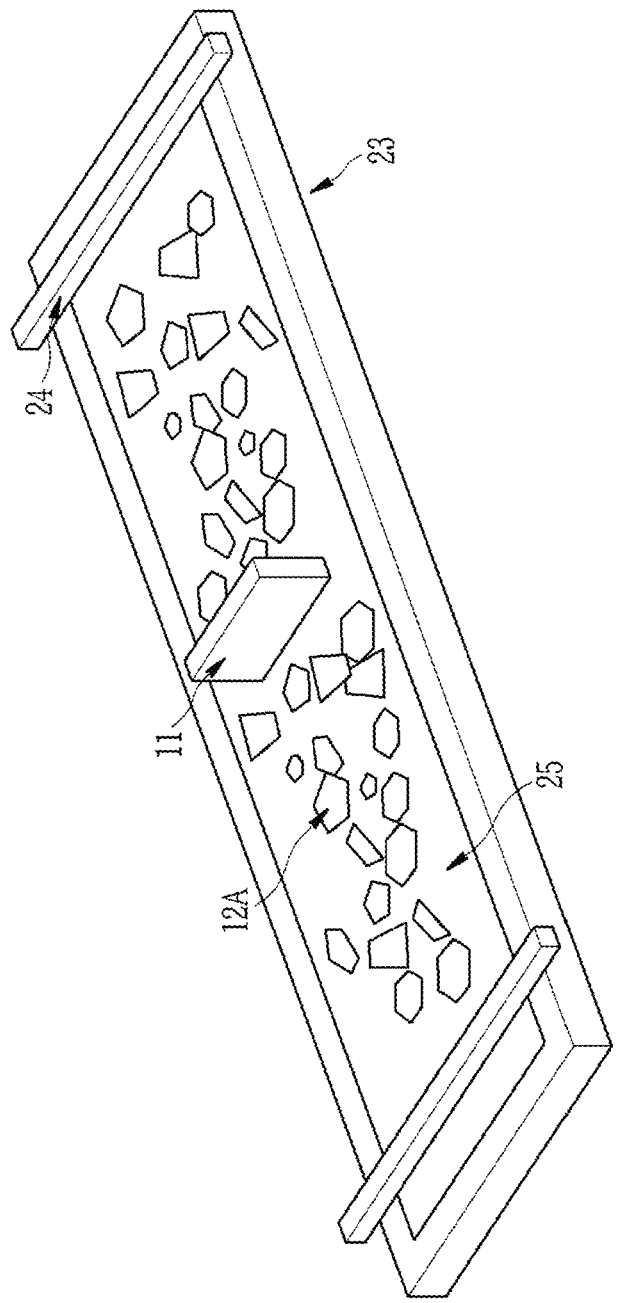
Figure 8:
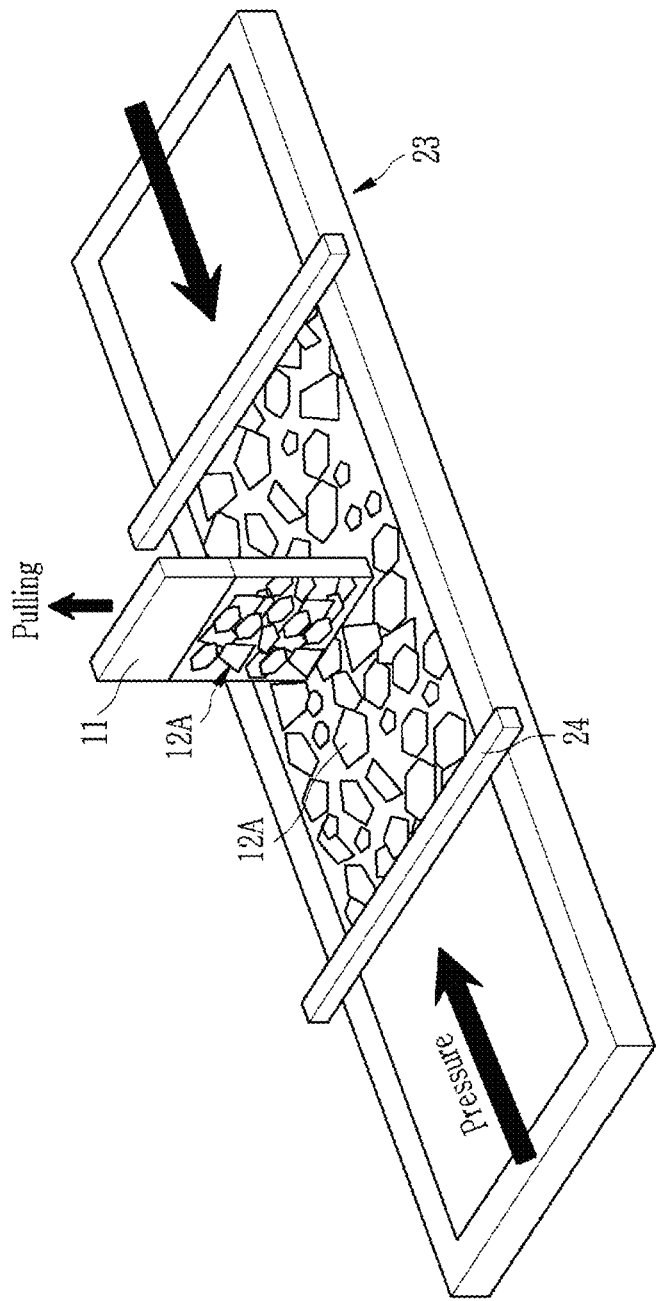
Figure 9:
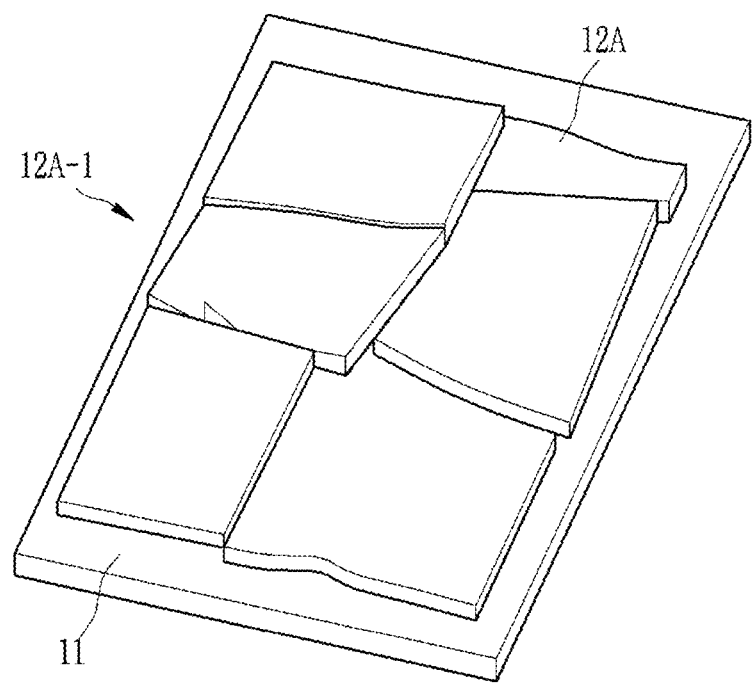
Figure 10:
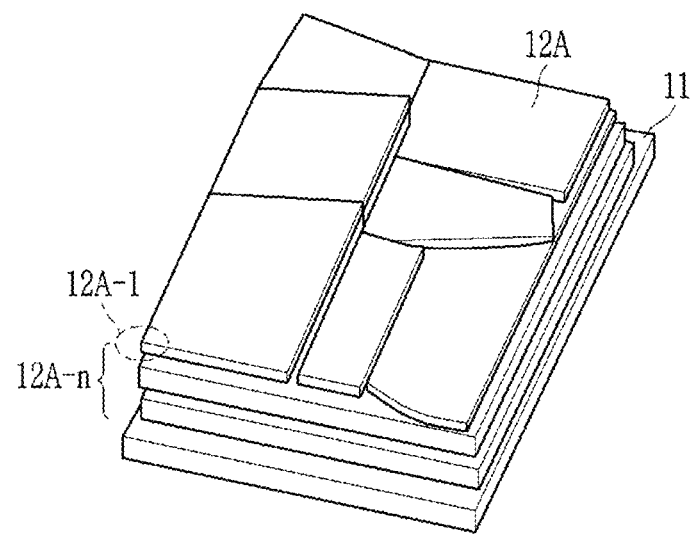

Referring to FIG. 7, the single crystal substrate 11 may be disposed in a vertical direction in a bath 23 and filled with nanosheet dispersion 25 including a plurality of nanosheets 12A. Subsequently, referring to FIG. 8, the plurality of nanosheets 12A may be attached on the single crystal substrate 11 by pressing barriers 24 disposed on both ends of the bath 23 toward the single crystal substrate 11 and by pulling the single crystal substrate 11 in a vertical direction. Subsequently, referring to FIG. 9, the single crystal substrate 11 attached with the plurality of nanosheets 12A may separate from the bath 23 and drying the same to obtain a two-dimensional nanosheet monolayer film (12A-1) in which the plurality of nanosheets 12A is arranged in a plane direction. Subsequently, referring to FIG. 10, the aforementioned method for the two-dimensional nanosheet monolayer film (12A-1) may be performed several times to obtain a plurality of two-dimensional nanosheet monolayers (12A-n). Herein, n may be for example 2 to 20, 2 to 15, 2 to 12, 2 to 10, 2 to 8, 2 to 7, or 2 to 5.

The total thickness of the two-dimensional nanosheet monolayer may be, for example, about 0.5 nm to about 1000 nm.

Subsequently, referring to FIG. 6B, the single crystal substrate 11 formed with the two-dimensional nanosheet monolayer (12A-1) is heat-treated to obtain a single crystal material 12.

The heat-treating may be performed at a temperature higher than the temperature which may change the crystal structure of the nanosheet 12A. The heat-treating may be performed, for example, at about 300° C. to about 1800° C., about 400° C. to about 1800° C., about 500° C. to about 1800° C., about 700° C. to about 1800° C., about 800° C. to about 1800° C., about 900° C. to about 1800° C., about 1000° C. to about 1800° C., about 1000° C. to about 1600° C., or about 1000° C. to about 1400° C.

The heat-treating may be performed, for example, under an oxidizing atmosphere and/or reduction atmosphere, for example, under $H_2$ gas atmosphere, $N_2$ atmosphere, $N_2/H_2$ mixed gas atmosphere, He atmosphere, He/$H_2$ mixed gas atmosphere, Ar atmosphere, Ar/$H_2$ mixed gas atmosphere, air atmosphere, and/or air/$H_2$ mixed gas atmosphere. The mixed gas atmosphere has a G:H$_2$ (G is N$_2$, He, Ar, or air) volume ratof, for example, about 1:99 to about 99:1, about 10:90 to about 90:10, about 20:80 to about 80:20, about 30:70 to about 70:30, about 40:60 to about 60:40, or about 50:50. The heat-treating may be performed for, for example, about 0.5 hours to about 6 hours, for example, about 1 hour to about 4 hours.

During the heat-treating, the crystal for the plurality of nanosheets 12A may be phase-changed using the crystal of the single crystal substrate 11 as a seed crystal, thereby, the crystal for the plurality of nanosheets 12A may be re-arranged to have an orientation substantially identical to the crystallographic direction of the single crystal substrate 11. Thereby, from the plurality of nanosheets 12A, the single crystal material 12 having the crystal structure substantially identical to the crystal structure of the single crystal substrate 11 may be formed.

Selectively, annealing may be further performed after the heat-treating. The annealing may be performed at a temperature lower than the heat-treating, for example, may be performed at about 200° C. to about 1000° C., for example, at about 250° C. to about 900° C., or about 280° C. to about 800° C.

The stacked structure 10 or the single crystal material 12 may be applied for the various fields requiring the single crystal characteristics, for example, may be applied as a dielectric for a ceramic electronic component.

Figure 11:
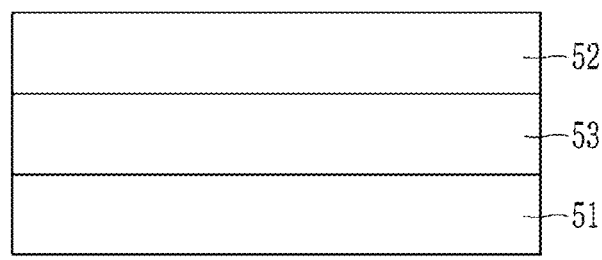
FIG. 11 is a schematic view showing an embodiment of a ceramic electronic component.

FIG. 11 is a schematic view showing a ceramic electronic component according to an embodiment.

FIG. 11 shows a capacitor 50 that is an example of the ceramic electronic component.

Referring to FIG. 11, a capacitor 50 according to an embodiment includes a pair of electrodes 51 and 52 facing each other and a dielectric 53.

The pair of electrodes 51 and 52 include a conductor, for example nickel (Ni), gold (Au), platinum (Pt), palladium (Pd), copper (Cu), silver (Ag), tin (Sn), an alloy thereof, or a combination thereof, but are not limited thereto. The pair of electrodes 51 and 52 may be a metal plate, for example a conductive layer, or a metal-plated plate on a substrate (not shown). Herein, the substrate may be for example a glass substrate, a semiconductor substrate, a polymer substrate, or a combination thereof. For example, when the single crystal substrate 11 is a conductor, the single crystal substrate 11 may be one of the pair of electrodes 51 and 52.

The dielectric 53 may include the aforementioned single crystal material 12.

Figure 12:
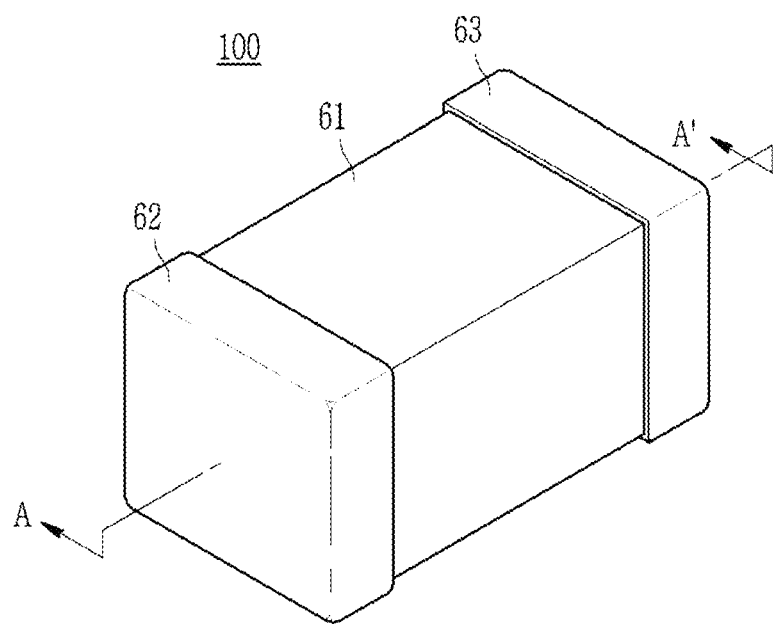
FIG. 12 is a schematic perspective view showing another aspect of the ceramic electronic component.
Figure 13:
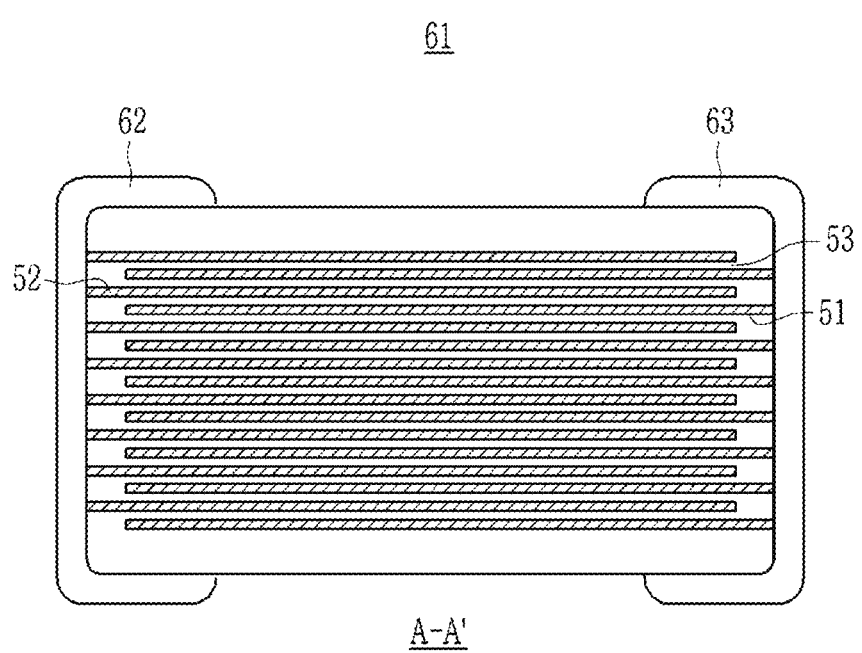
FIG. 13 is a cross-sectional view showing the ceramic electronic component of FIG. 12 taken along line A-A'.

FIG. 12 is a schematic perspective view of a ceramic electronic component according to another embodiment and FIG. 13 is a cross-sectional view of the ceramic electronic component of FIG. 12 taken along the A-A' direction.

The ceramic electronic component according to the present embodiment may be multi-layer ceramic capacitor (MLCC) 100 having a stacked structure in which the capacitors of FIG. 11 are stacked.

Referring to FIGS. 12 and 13, the MLCC 100 includes a capacitor body 61 and external electrodes 62 and 63. The capacitor body 61 may have a stacked structure wherein a plurality of the capacitors 50 of FIG. 4 are stacked, and each of the capacitors includes the electrode (internal electrodes) 51 and 52 and the dielectric 53 as described above. The details therefor are the same as described above.

As an example of the ceramic electronic component, a capacitor and a MLCC are described above, but the present disclosure is not limited thereto, and it may be applied for all electronic components using ceramic such as a piezoelectric device, a varistor, or a thermistor.

The ceramic electronic component such as the aforementioned capacitor and MLCC may be included in a variety of devices, for example, may be employed for an image device such as a liquid crystal display (LCD), a computer, a mobile phone, or a vehicle device such as an electric vehicle or a smart car.

Hereinafter, the embodiments are illustrated in more detail with reference to examples. However, these examples are exemplary, and the present scope is not limited thereto.

EXAMPLES

Synthesis Examples

Synthesis Example 1: Synthesis of Nanosheet (Ca$_2$Na$_2$Nb$_5$O$_{16}$)

K$_2$CO$_3$, CaCO$_3$, Nb$_2$O$_5$, and NaNbO$_3$ (Sigma Aldrich) are prepared. Subsequently, the powders are added to ethanol and then, mixed therewith by using a ball mill for 24 hours. Then, the mixed powders are dried, while still mixed by using with a magnetic bar and a hot plate. The dried powder is additionally sufficiently dried in an oven at 100° C. for 1 day. Then, the obtained powder is calcined at 1200° C. under an air atmosphere for 10 hours to prepare a KCa$_2$Na$_2$Nb$_5$O$_{16}$ layered material.

Then, the KCa$_2$Na$_2$Nb$_5$O$_{16}$ layered material is put in a HCl solution or a HNO$_3$ solution, and then, the mixture is stirred and filtered to obtain a HCa$_2$Na$_2$Nb$_5$O$_{16}$ powder. The obtained HCa$_2$Na$_2$Nb$_5$O$_{16}$ powder is added to a tetrabutylammonium hydroxide solution (TBAOH), and the obtained mixture is stirred and centrifuged to be exfoliated into a plurality of nanosheets. Herein, HCa$_2$Nb$_3$O$_{10}$·1.5H$_2$O and TBAOH are mixed in a ratof about 1:1. The exfoliation proceeds at room temperature for 7 days at 150 rpm, while the mixture is mechanically shaken. Subsequently, after removing a precipitate at the bottom of the beaker, the residue thereof is centrifuged for 30 minutes at 2,000 rpm using a centrifuge, a supernatant (⅔) is used, while the rest thereof is discarded. The centrifuged supernatant is dialyzed by using a membrane to remove a tetrabutylammonium aqueous solution therefrom and prepare nanosheet dispersion including Ca$_2$Na$_2$Nb$_5$O$_{16}$ nanosheets. The Ca$_2$Na$_2$Nb$_5$O$_{16}$ nanosheet has a layered perovskite structure and has an average thickness of about 1.5 nm and an average lateral size of about 500 nm.

Synthesis Example 2: Synthesis of Nanosheet (Sr$_{1.8}$Ba$_{0.2}$Nb$_3$O$_{10}$)

K$_2$CO$_3$, SrCO$_3$, Nb$_2$O$_5$, and BaCO$_3$ (Sigma Aldrich) are prepared. Subsequently, the powders are added to ethanol and then, mixed therewith by using a ball mill for 24 hours. Then, the mixed powders are dried, while still mixed with a magnetic bar and a hot plate. The dried powders are additionally sufficiently dried in an oven at 100° C. for 1 day. Subsequently, the obtained powder is calcined at 1200° C. under an air atmosphere for 24 hours to prepare a KSr$_{1.8}$Ba$_{0.2}$Nb$_3$O$_{10}$ layered material.

Then, the KSr$_{1.8}$Ba$_{0.2}$Nb$_3$O$_{10}$ layered material is put in a HCl solution or a HNO$_3$ solution, and the mixture is stirred and filtered to obtain a HSr$_{1.8}$Ba$_{0.2}$Nb$_3$O$_{10}$ powder. The obtained HSr$_{1.8}$Ba$_{0.2}$Nb$_3$O$_{10}$ powder is added to a tetrabutylammonium hydroxide solution (TBAOH), and the obtained mixture is stirred and centrifuged to be exfoliated into a plurality of nanosheets. Herein, HSr$_{1.8}$Ba$_{0.2}$Nb$_3$O$_{10}$·1.5H$_2$O and TBAOH are mixed in a ratof about 1:1. The exfoliation proceeds at room temperature for 7 days at 150 rpm, while the mixture is mechanically shaken. Subsequently, after removing a precipitate at the bottom of the beaker, the residue thereof is centrifuged for 30 minutes at 2,000 rpm using a centrifuge, a supernatant (⅔) is used, while the rest thereof is discarded. The centrifuged supernatant is dialyzed by using a membrane to remove a tetrabutylammonium aqueous solution therefrom and prepare nanosheet dispersion including a $Sr_{1.8}Ba_{0.2}Nb_3O_{10}$ nanosheet. The $Sr_{1.8}Ba_{0.2}Nb_3O_{10}$ nanosheet has a layered perovskite structure and an average thickness of about 2 nm and an average lateral size of about 300 nm.

Preparation Examples

Preparation Example 1

The $Ca_2Na_2Nb_5O_{16}$ nanosheet dispersion obtained from Synthesis Example 1 is coated on a Nb-doped $SrTiO_3$ (100) single crystal substrate (Nb-STO, manufacturer: MTI Corp.) by Langmuir-Blodgett method (KSV NIMA) with a substrate lifting speed of 1 millimeters per minute (mm/min) and a surface pressure of 12 millinewtons per square meter ($mN/m^2$) to provide a two-dimensional nanosheet monolayer. Subsequently, the coating is further performed for 4 more times to provide a total five-layered two-dimensional nanosheet monolayer.

Subsequently, the heat-treating is performed under the air and H2 atmosphere at a temperature of 1250° C. for 2 hours, and furthermore, annealing is performed under the air atmosphere at a temperature of 700° C. for 2 hours to provide a stacked structure in which a single crystal material is formed on the Nb-doped $SrTiO_3$ single crystal substrate.

Preparation Example 2

The $Sr_{1.8}Ba_{0.2}Nb_3O_{10}$ nanosheet dispersion obtained from Synthesis Example 2 is coated on the Nb-doped $SrTiO_3$ (100) single crystal substrate (Nb-STO) (manufacturer: MTI Corp.) by a Langmuir-Blodgett method (KSV NIMA) with a substrate lifting speed of 1 mm/min and a surface pressure of 15 $mN/m^2$ to provide a two-dimensional nanosheet monolayer. Subsequently, the coating is further performed for 2 more times to provide a total three-layered two-dimensional nanosheet monolayer.

Subsequently, the heat-treating is performed under the air and $H_2$ atmosphere at a temperature of 1250° C. for 2 hours, and furthermore, annealing is performed under the air atmosphere at a temperature of 700° C. for 2 hours to provide a stacked structure in which a single crystal material is formed on the Nb-doped $SrTiO_3$ single crystal substrate.

Evaluation I

Changes to the atomic structure and the cross-sectional surface of the thin film in Preparation Examples 1 and 2 before and after the heat-treating are observed using a high resolution transmission electron microscope (HR-TEM).

Figure 14:
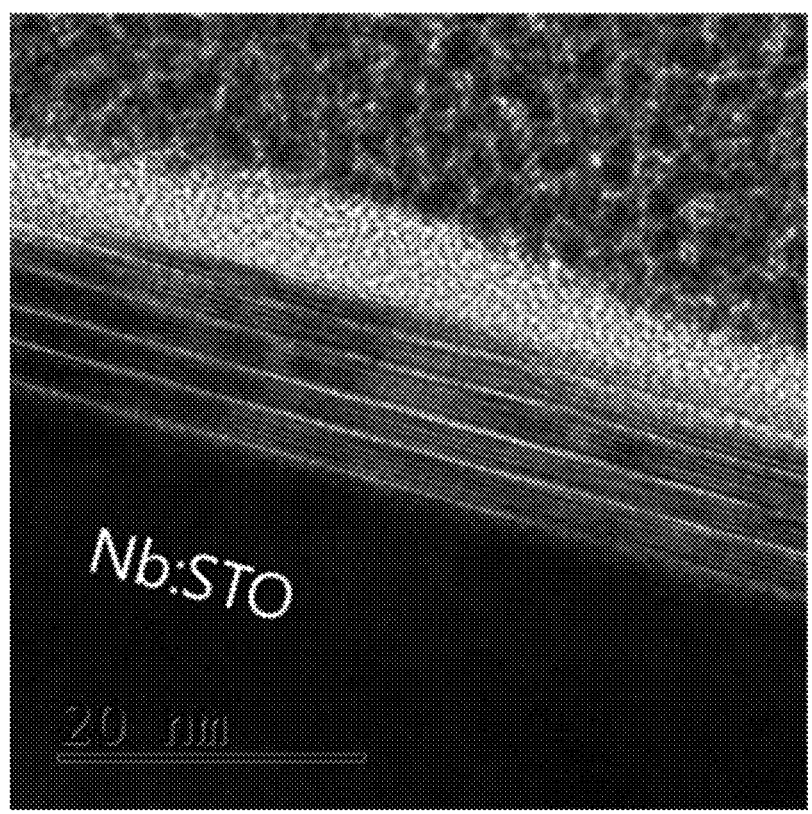
FIG. 14 is an HR-TEM photograph showing a cross-section of the stacked structure before heat-treating in Preparation Example 1.
Figure 15:
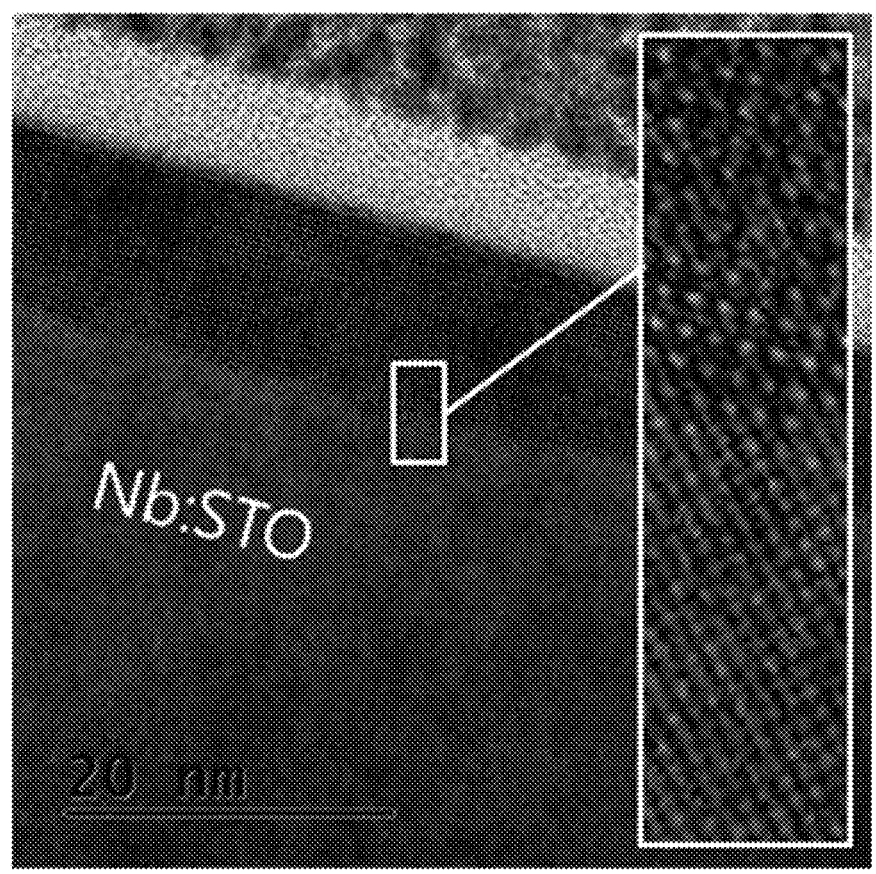
FIG. 15 is an HR-TEM photograph showing a cross-section of the stacked structure after heat-treating in Preparation Example 1.

FIG. 14 is an HR-TEM photograph showing a cross-section of the stacked structure before heat-treating in Preparation Example 1 and FIG. 15 is an HR-TEM photograph showing a cross-section of the stacked structure after heat-treating in Preparation Example 1.

Referring to FIGS. 14 and 15, it is confirmed that the five-layered two-dimensional nanosheet monolayer is changed by heat-treating to provide a single crystal material having the same orientation as the orientation of the single crystal substrate.

Figure 16:
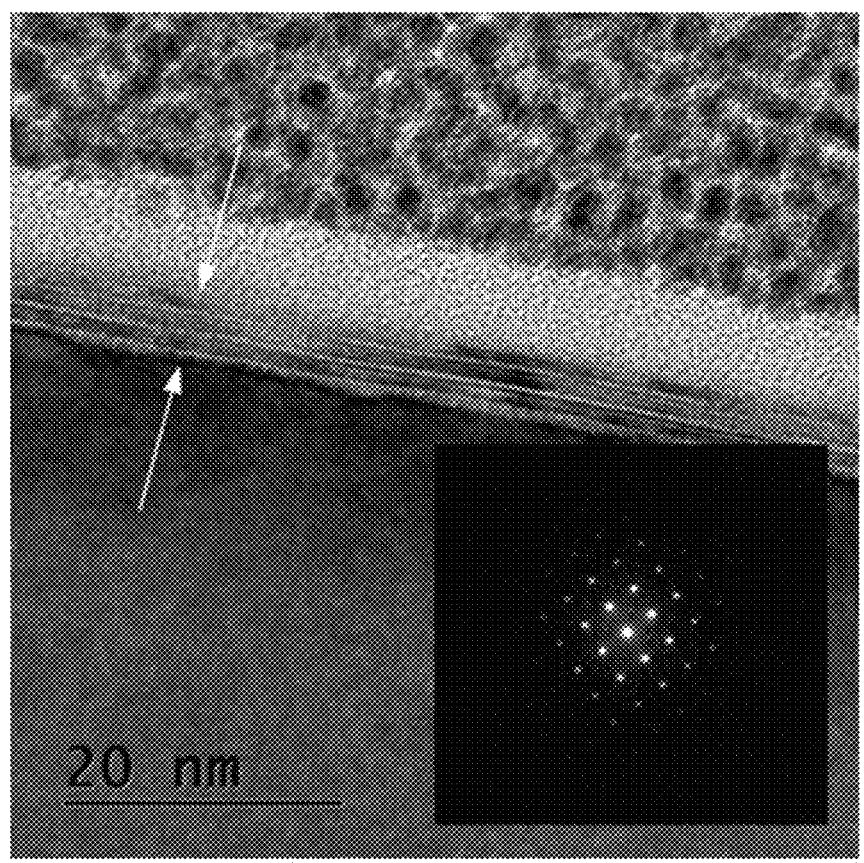
FIG. 16 is an HR-TEM photograph showing a cross-section of the stacked structure before heat-treating in Preparation Example 2.
Figure 17:
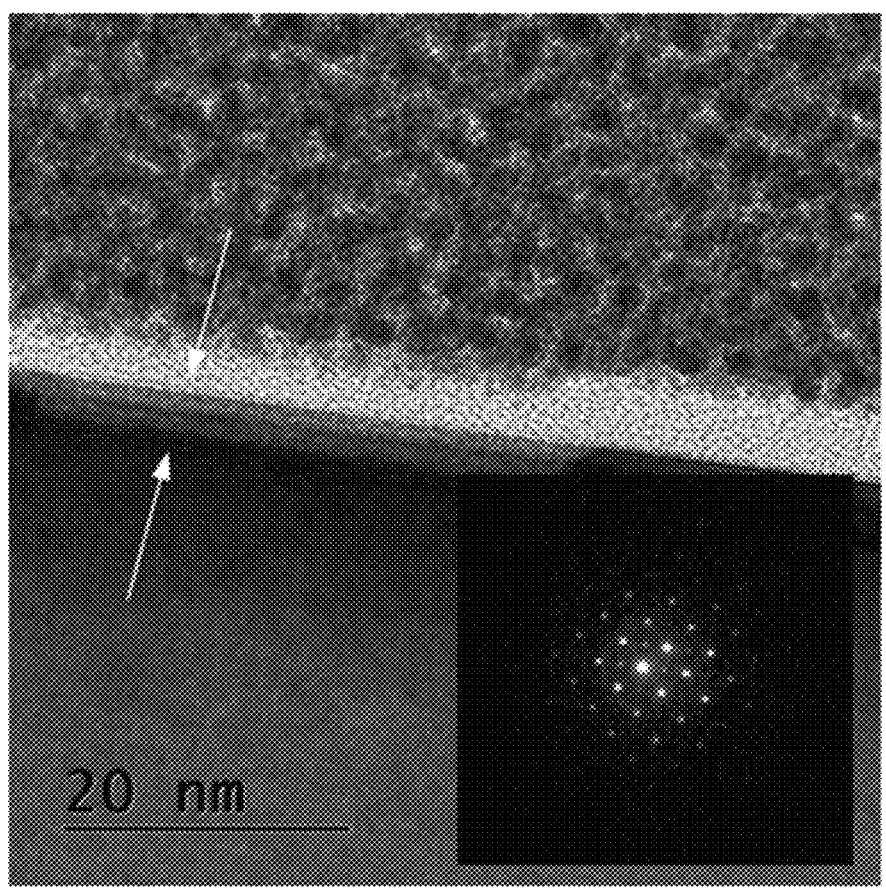
FIG. 17 is an HR-TEM photograph showing a cross-section of the stacked structure after heat-treating in Preparation Example 2.

FIG. 16 is an HR-TEM photograph showing a cross-section of the stacked structure before heat-treating in Preparation Example 2 and FIG. 17 is an HR-TEM photograph showing a cross-section of the stacked structure after the heat-treating in Preparation Example 2.

Referring to FIGS. 16 and 17, it is confirmed that the three-layered two-dimensional nanosheet monolayer before the heat-treating is changed by the heat-treating to provide a single crystal material having the same orientation as the single crystal substrate.

Evaluation II

The crystal structure of the single crystal material of the stacked structure according to Preparation Example 1 is determined by an X-ray diffraction (XRD) analysis.

Figure 18:
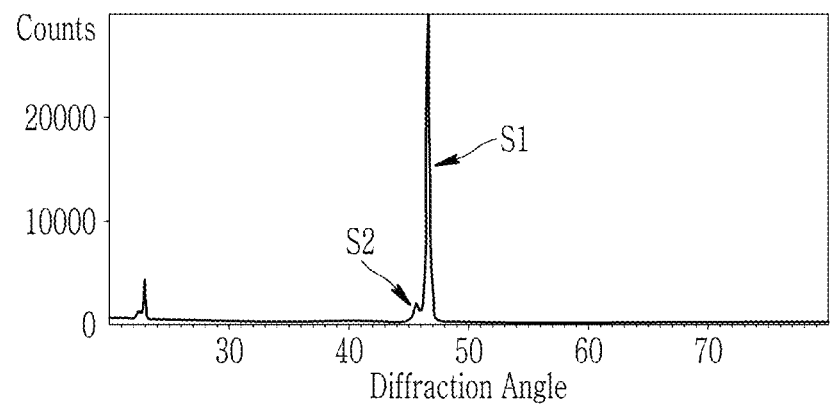
FIGS. 18 and 19 are each of graph of diffraction angle (degrees 2-theta) versus intensity (counts) showing the results of X-ray diffraction analysis of the stacked structures according to Preparation Example 1.
Figure 19:
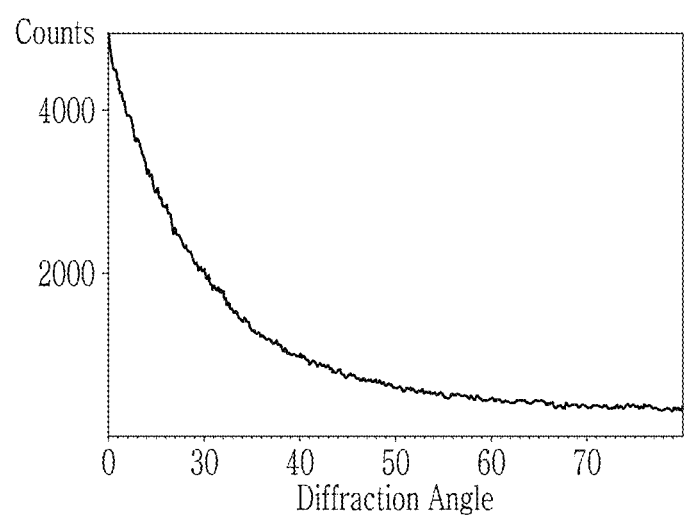
Figure 20A:
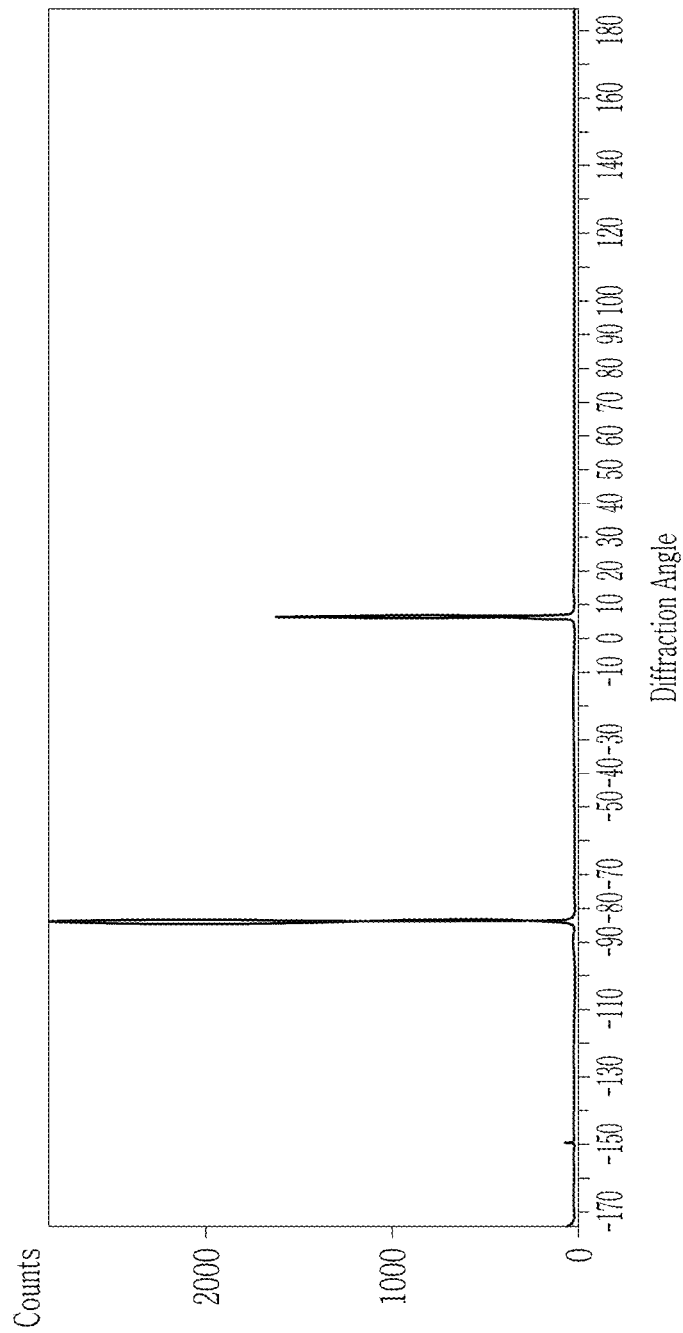
FIG. 20A is a graph of diffraction angle (degrees Phi) versus intensity (counts) showing the results of X-ray diffraction analysis of the stacked structures according to Preparation Example 1.

FIGS. 18 and 19 are each of graph of diffraction of angle (degrees 2-theta) versus intensity (counts) showing the results of X-ray diffraction analysis of the stacked structures according to Preparation Example 1; FIG. 20A is a graph of diffraction angle (degrees Phi) versus intensity (counts) showing the results of X-ray diffraction analysis of the stacked structures according to Preparation Example 1; and FIG. 20B is an enlarged view of a portion of FIG. 20A.

Referring to FIG. 18, from the single crystal material, it is confirmed that another diffracted peak (S2) is observed in a direct front of the diffraction peak (51) of the single crystal substrate (Nb-doped $SrTiO_3$) in the XRD graph from a Θ-2Θscan. Referring to FIG. 19, it is confirmed that the diffraction peak disappeared when rotating about a phi axis in about 30 degrees, thereby it is confirmed that the single crystal material has the same orientation as the crystallographic direction of the single crystal substrate (100) (Nb-doped $SrTiO_3$).

Figure 20B:
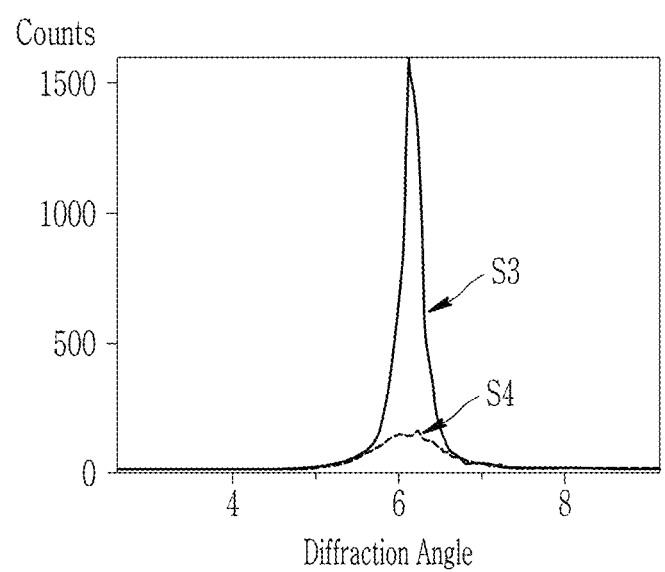
FIG. 20B is an enlarged view of a portion of FIG. 20A.

Referring to FIGS. 20A and 20B, each of the single crystal substrate and the single crystal material is disposed with a detector and performed with a phi-scan. From the results, it is confirmed that the diffraction peak (S4) of the single crystal material is present in the same position as the diffraction peak (S3) of the single crystal substrate. Thereby, it is confirmed that the single crystal material and the single crystal substrate have the same plane direction.

Evaluation III

Atomic components of the single crystal material of the stacked structure according to Preparation Examples 1 and 2 are analyzed using a transmission electron microscope-energy dispersive spectroscopy (TEM-EDS).

Figure 21A:
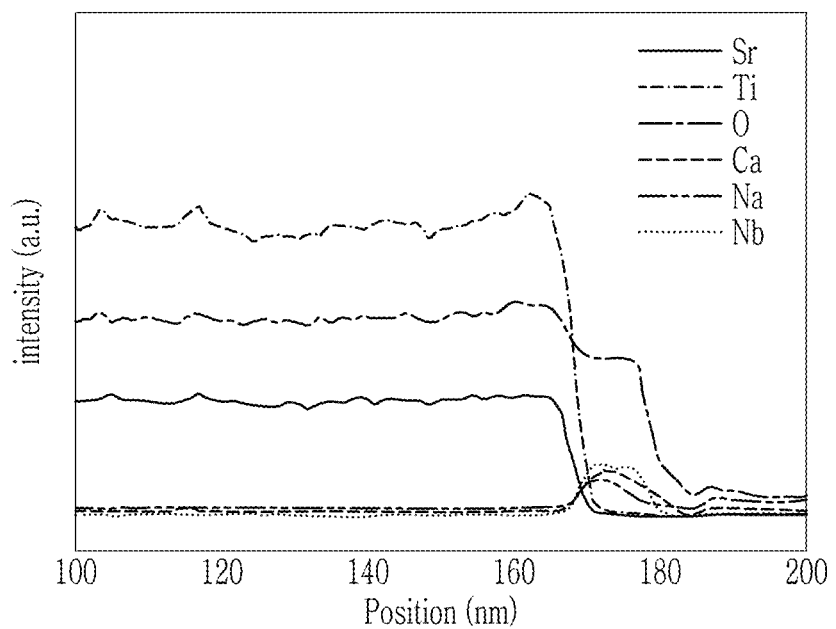
FIG. 21A is a graph of position (nanometers) versus intensity (arbitrary units, a.u.) for the two-dimensional nanosheet monolayer before heat-treating in Preparation Example 1.
Figure 21B:
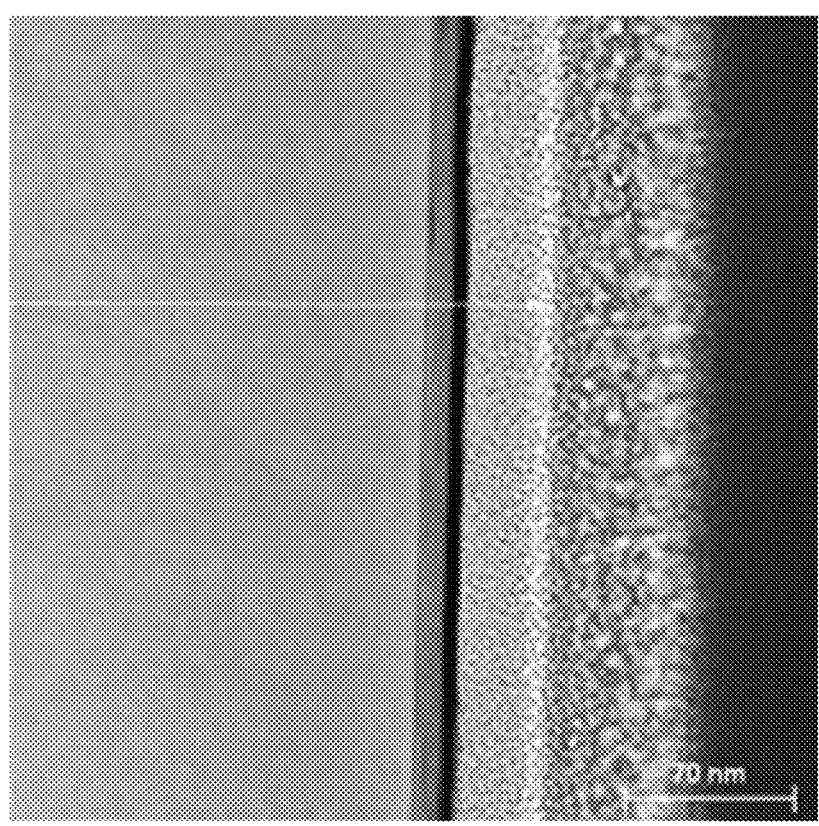
FIG. 21B a TEM-EDS image showing the location of the scan for the results shown in FIG. 21A.
Figure 22A:
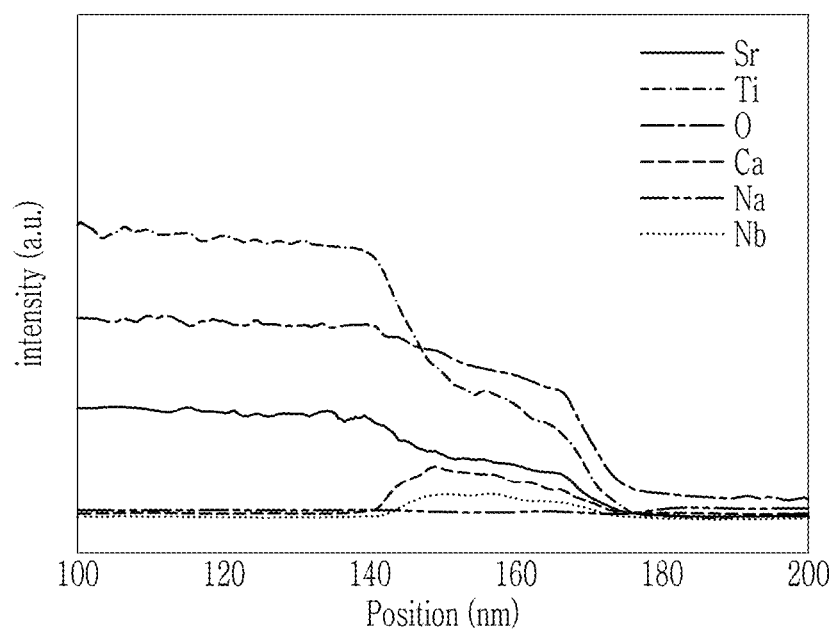
FIG. 22A is a graph of position (nanometers) versus intensity (arbitrary units, a.u.) for the single crystal material after heat-treating in Preparation Example 1.
Figure 22B:
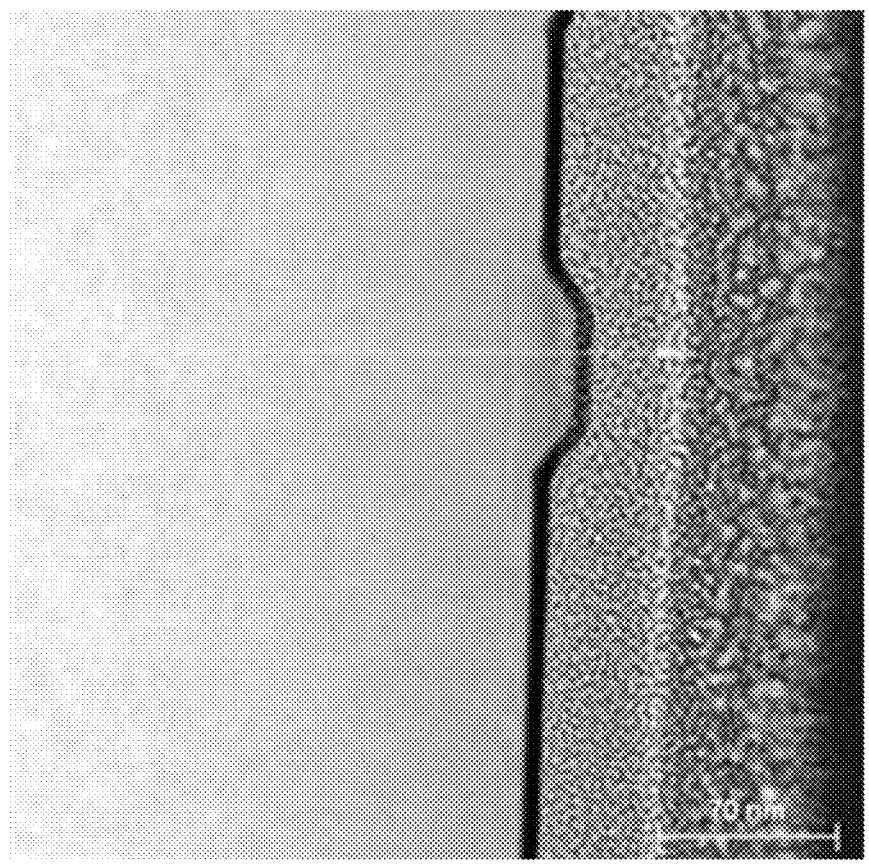
FIG. 22B is a TEM-EDS image showing the location of the scan for the results shown in FIG. 22A.

FIG. 21A is a graph of position (nanometers) versus intensity (arbitrary units, a.u.) for the two-dimensional nanosheet monolayer before heat-treating in Preparation Example 1; FIG. 21B a TEM-EDS image showing the location of the scan for the results shown in FIG. 21A; FIG. 22A is a graph of position (nanometers) versus intensity (arbitrary units, a.u.) for the single crystal material after heat-treating in Preparation Example 1; and FIG. 22B is a TEM-EDS image showing the location of the scan for the results shown in FIG. 22A.

Referring to FIGS. 21A to 22B, it is confirmed that the single crystal material after the heat-treating includes all the atoms for the two-dimensional nanosheet monolayer before the heat-treating. Thus it is confirmed that the atomic components are not changed between before and after the heat-treating.

Figure 23:
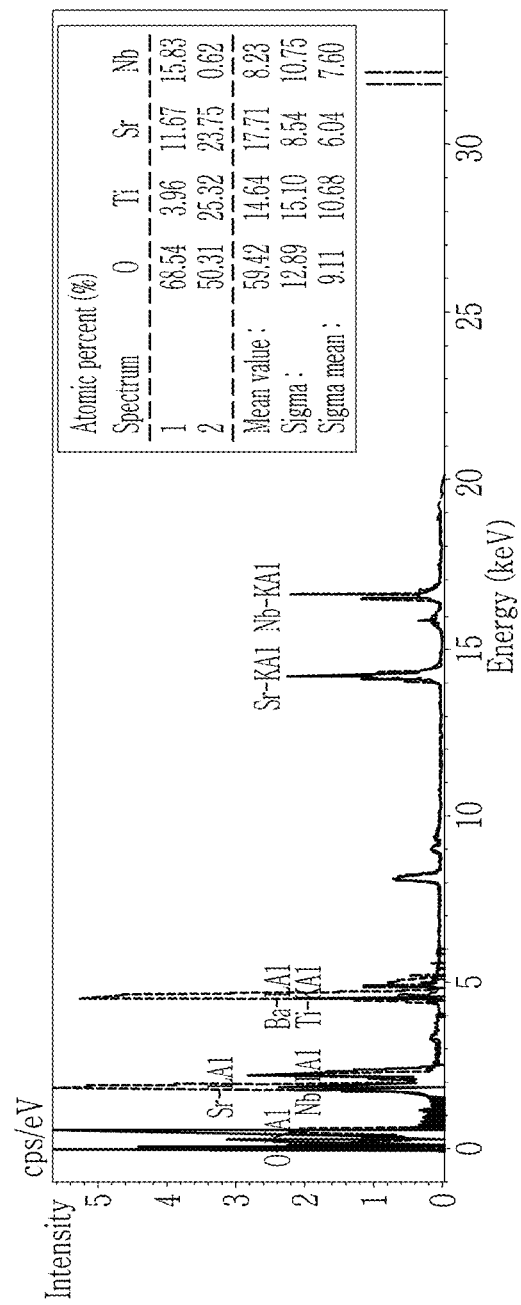
FIG. 23 is a graph of energy (kiloelectron-volts, keV) versus intensity (counts) showing the results of TEM-EDS analysis of the two-dimensional nanosheet monolayer before heat-treating in Preparation Example 2.
Figure 24:
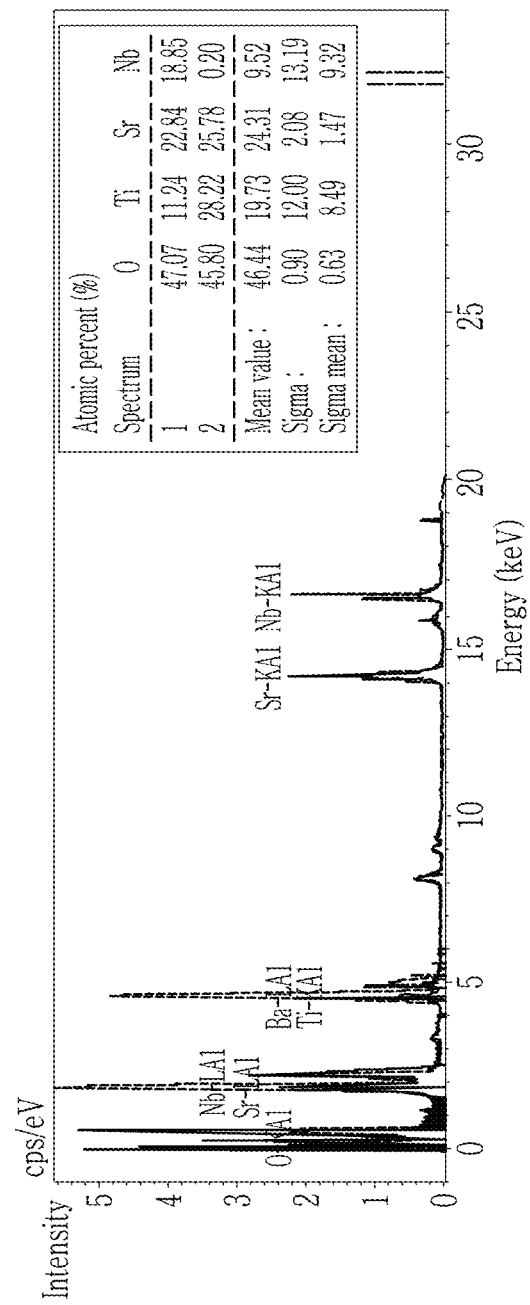
FIG. 24 is a graph of energy (kiloelectron-volts, keV) versus intensity (counts) showing the results of TEM-EDS analysis of the single crystal layer after heat-treating in Preparation Example 2.

FIG. 23 is a graph of energy (kiloelectron-volts, keV) versus intensity (counts) showing the results of TEM-EDS analysis of the two-dimensional nanosheet monolayer before heat-treating in Preparation Example 2 and FIG. 24 is a graph of energy (kiloelectron-volts, keV) versus intensity (counts) showing the results of TEM-EDS analysis of the single crystal layer after heat-treating in Preparation Example 2.

Referring to FIGS. 23 and 24, it is confirmed that the single crystal material after the heat-treating includes all the atoms for the two-dimensional nanosheet monolayer before the heat-treating. Thereby, it is confirmed that the atomic components are not changed between before and after the heat-treating.

EXAMPLES

Example 1

A Pt electrode is formed on the stacked structure according to Preparation Example 1 to provide a capacitor.

Example 2

A Pt electrode is formed on the stacked structure according to Preparation Example 2 to provide a capacitor.
Evaluation IV The capacitors according to Examples 1 and 2 are evaluated for a dielectric constant and a dielectric loss.

The dielectric constant and the dielectric loss are evaluated using a 4284A LCR meter.

The results are shown in Table 1.

TABLE 1

|  | Dielectric constant (1 kHz) | Dielectric loss (tanδ, %) |
|---|---|---|
| Example 1 | 93 | 0.09 |
| Example 2 | 35 | 0.09 |

Referring to Table 1, it is confirmed that the capacitors according to Examples 1 and 2 have excellent dielectric characteristics.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A single crystal material, the single crystal material being a multinary single crystal material comprising at least three elements, wherein the single crystal material is a sintered product of a plurality of nanosheets,
a crystal structure of the sintered product of the plurality of nanosheets is different from a crystal structure of the plurality of nanosheets, and
a plane direction of the sintered product of the plurality of nanosheets is one of (100), (111), (110), or (010).

2. The single crystal material of claim 1, wherein the single crystal material comprises each of the elements contained in the plurality of nanosheets.

3. The single crystal material of claim 1, wherein the single crystal material is an oxide, a nitride, a sulfide, a phosphide, an arsenide, or a carbide of a multinary material.

4. The single crystal material of claim 1, wherein the single crystal material is a ternary to quinary material.

5. The single crystal material of claim 1, wherein the plurality of nanosheets comprise an exfoliated nanostructure of a layered material, a chalcogenide, a carbon structure, or a heterostructure.

6. The single crystal material of claim 5, wherein the exfoliated nanostructure of the layered material is an exfoliated nanostructure of a layered perovskite.

7. The single crystal material of claim 6, wherein the exfoliated structure of the layered material is represented by one of Chemical Formulas 1 to 3

$$A_{(n-1)}M_nO_{(3n+1)} \qquad \text{Chemical Formula 1}$$

$$A_pM_{(p-1)}O_{3p} \qquad \text{Chemical Formula 2}$$

$$M_pO_{(sp+1)} \qquad \text{Chemical Formula 3}$$

wherein, in Chemical Formulas 1 to 3,
each A is independently selected from Na, K, Rb, Mg, Ca, Sr, Ba, Bi, Hf, Ag, Cd, Ti, Pb, and a lanthanide element,
M is different from A and each M is independently selected from Li, Sc, Ti, Zr, V, Nb, Ta, Cr, Mo, W, Mn, Tc, Re, Fe, Ru, Os, Co, Rh, Ir, Ni, Pd, Pt, Cu, Zn, Al, Ga, In, Ge, Sn, Sb, Bi, and Te,
n≥1, and p≥1.

8. The single crystal material of claim 6, wherein the exfoliated structure of the layered material is selected from $Ca_2Nb_3O_{10}$, $Ca_2NaNb_4O_{13}$, $Ca_2Na_2Nb_5O_{16}$, $Sr_2Nb_3O_{10}$, $Sr_{2-x}Ba_xNb_3O_{10}$ wherein 0<x<2$SrBi_4Ti_4O_{15}$, $Sr_{2-x}Ba_xBi_4Ti_4O_{15}$, wherein 0<x<2, $Ti_2NbO_7$, and $LaNb_2O_7$.

9. The single crystal material of claim 1, wherein the single crystal material is in a form of a film having a thickness of about 0.5 nanometers to about 100 nanometers.

10. A stacked structure, comprising:
a single crystal substrate, and
a single crystal material of claim 1 on the single crystal substrate.

11. The stacked structure of claim 10, wherein X-ray diffraction peaks of the single crystal material are in a substantially identical region as X-ray diffraction peaks of the single crystal substrate.

12. The stacked structure of claim 10, wherein the single crystal substrate and the single crystal material have an identical crystal structure, and the identical crystal structure is a cubic, trigonal, orthorhombic, hexagonal, or rhombohedral crystal structure.

13. The stacked structure of claim 10, wherein the single crystal substrate comprises a metal, a semi-metal, a binary compound, an oxide, a nitride, a sulfide, a phosphide, an arsenide, a carbide, or a combination thereof.

14. The stacked structure of claim 10, wherein the single crystal substrate comprises at least one of barium and strontium, and titanium.

15. A ceramic electronic component comprising the stacked structure of claim 10.

16. The ceramic electronic component of claim 15, wherein the ceramic electronic component is multi-layer ceramic capacitor.

17. A device comprising the ceramic electronic component of claim 15.

18. A ceramic electronic component comprising the single crystal material of claim 1.

19. The ceramic electronic component of claim 18, wherein the ceramic electronic component is multi-layer ceramic capacitor.

20. A device comprising the ceramic electronic component of claim 18.

* * * * *